(12) United States Patent
Baek et al.

(10) Patent No.: US 7,473,993 B2
(45) Date of Patent: Jan. 6, 2009

(54) SEMICONDUCTOR STACK PACKAGE AND MEMORY MODULE WITH IMPROVED HEAT DISSIPATION

(75) Inventors: Joong-Hyun Baek, Gyeonggi-do (KR); Sang-Wook Park, Gyeonggi-do (KR); Hae-Hyung Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 260 days.

(21) Appl. No.: 11/057,007

(22) Filed: Feb. 11, 2005

(65) Prior Publication Data
US 2005/0199992 A1 Sep. 15, 2005

(30) Foreign Application Priority Data
Mar. 12, 2004 (KR) ................ 10-2004-0016902

(51) Int. Cl.
*H01L 23/02* (2006.01)
(52) U.S. Cl. ................ 257/686; 257/678; 257/706; 257/707; 257/723; 257/777; 257/778; 257/787; 257/788; 438/106; 438/107; 438/108; 438/109; 438/110; 438/127
(58) Field of Classification Search ........... 257/686, 257/723, 777, 778, 678, 696, 706, 707, 787, 257/788; 438/109–110, 118, 106, 107, 108, 438/127; 361/735, 790
See application file for complete search history.

(56) References Cited

U.S. PATENT DOCUMENTS 6,297,960 B1 10/2001 Moden et al.
6,607,937 B1 * 8/2003 Corisis ................ 438/108
6,753,207 B2 * 6/2004 Hur ..................... 438/109

(Continued)

FOREIGN PATENT DOCUMENTS

JP        09-022982        1/1997

(Continued)

OTHER PUBLICATIONS

English language abstract of Korean Publication No. 10-0432715.

(Continued)

*Primary Examiner*—Phuc T Dang
*Assistant Examiner*—Thanh Y Tran
(74) *Attorney, Agent, or Firm*—Marger Johnson & McCollom, P.C.

(57) ABSTRACT

A semiconductor stack package includes lower and upper individual packages. When the upper individual package is stacked on the lower individual package, a heat-conducting layer provided under the upper package touches a heat-mediating layer provided on the lower package. Thus, a layer of trapped air found in conventional stack packages is eliminated, and a direct heat-dissipating path is produced through both the heat-conducting layer and the heat-mediating layer. Therefore, the heat dissipation of the stack package is improved. Alternatively, the stack package may have a symmetric configuration in which each IC chip faces away from each other. A memory module has several stack packages mounted on one or both surfaces of a module board. The method includes forming the packages and stacking the packages. The method further includes forming a module board and mounting the stack packages on the module board.

16 Claims, 12 Drawing Sheets

U.S. PATENT DOCUMENTS

| | | | |
|---|---|---|---|
| 6,838,761 B2* | 1/2005 | Karnezos | 257/685 |
| 7,064,426 B2* | 6/2006 | Karnezos | 257/686 |
| 7,273,769 B1* | 9/2007 | Brand | 438/122 |
| 2002/0074636 A1* | 6/2002 | Siu | 257/678 |
| 2004/0173903 A1* | 9/2004 | Yang et al. | 257/738 |
| 2005/0046039 A1* | 3/2005 | Yang et al. | 257/778 |

FOREIGN PATENT DOCUMENTS

| | | |
|---|---|---|
| KR | 97-13285 | 3/1997 |
| KR | 2000-0006234 | 1/2000 |
| KR | 10-0432715 | 5/2004 |

OTHER PUBLICATIONS

English language abstract of Japanese Publication No. 09-022982.
English language abstract of Korean Publication No. 97-13285.
English language abstract of Korean Publication No. 2000-0006234.

* cited by examiner

SEMICONDUCTOR STACK PACKAGE AND MEMORY MODULE WITH IMPROVED HEAT DISSIPATION

CROSS REFERENCE TO RELATED APPLICATIONS

This U.S. non-provisional application claims priority under 35 U.S.C. §119 to Korean Patent Application No. 2004-16902 filed Mar. 12, 2004, the contents of which are incorporated herein in its entirety by reference.

BACKGROUND OF THE INVENTION

1. Field of the Invention

The present invention relates generally to electronic packaging technology and, more particularly, to a three-dimensional semiconductor stack package and a memory module using the stack packages.

2. Description of the Related Art

In general, a semiconductor package is defined as the housing and interconnection of integrated circuits, also referred to as chips or die, to form an electronic system. One of the functions that the package provides is to remove heat generated by the chips or system. Therefore heat dissipation becomes a much more important factor that must be considered during the design or fabrication of the packages, especially in view of recent advances in packages having high integration, high memory density and high speed. A three-dimensional stack package in which several individual packages are arranged is a good example.

FIGS. 1 to 3 show, in cross-sectional views, three types of conventional stack packages. Referring to FIGS. 1 to 3, each stack package 10, 20 and 30 has a two-layered structure (FIGS. 1 and 2) or a four-layered structure (FIG. 3).

The stack packages 10 and 20, shown in FIGS. 1 and 2, includes two individual packages 11*a* and 11*b* or 21*a* and 21*b* that are arranged in layers. Each individual package 11*a* and 11*b* or 21*a* and 21*b* has an integrated circuit (IC) chip 13 attached to a top face (in FIG. 1) or a bottom face (in FIG. 2) of a circuit substrate 14. The IC chip 13 is electrically coupled to the circuit substrate 14 via metal wires 15 that pass through a central opening of the circuit substrate 14 and are protected by an encapsulant 16. Mechanical and electrical connections between the individual packages 11*a* and 11*b* or 21*a* and 21*b* are made by solder balls 17 formed at peripheral parts of the bottom face of the circuit substrate 14.

The stack package 30 shown in FIG. 3 includes four individual packages 31*a*, 31*b*, 31*c* and 31*d* that are arranged in layers. Each individual package 31*a*, 31*b*, 31*c* and 31*d* has the same structure as discussed above. The stack package 30 is mounted on a module board 32 via the solder balls 17 of the lowermost individual package 31*a*. It is known in this art that such a conventional stack package may be configured up to an eight-layered structure.

FIG. 4 shows, in a plan view, a conventional memory module 49. As shown in FIG. 4, several stack packages 40 are mounted on one or both surfaces of the module board 42, thus constituting a memory module having high memory density.

Generally, heat generated from the IC chip in actual use of the memory module 49 escapes toward the module board 42 and toward the air. However, the above-described stack packages have poor heat dissipation because unfavorable air gaps 18 (shown in FIGS. 1 to 3) exist between the individual packages and between the lowermost package and the module board.

FIG. 5 is a temperature distribution diagram produced by simulation of heat dissipation in a conventional stack package. The simulation was applied to two memory modules inserted in a server system, and each memory module used has eighteen stack packages mounted on both surfaces of the module board 42. FIG. 5 shows a pair of upper and lower stack packages 40*a* and 40*b* on both surfaces of one memory module.

As appreciated from FIG. 5, the heat dissipation property of the stack packages 40*a* and 40*b* degrades around the air gaps. This is caused by relatively poor heat conductivity of air and a heat-trapping phenomenon occurring in the air gap. Such low heat dissipation becomes serious as the number of the individual packages increases. Furthermore, since cooling efficiency is reduced as the width of the air gap becomes narrower; the heat dissipation of the package lowers. As a result, a conventionally used stack package and memory module cannot avoid degradation of reliability due to a rise in temperature.

SUMMARY OF THE INVENTION

Exemplary, non-limiting embodiments of the present invention provide a semiconductor stack package and a related memory module having improved heat dissipation by providing improved heat dissipation paths and eliminating unfavorable air gaps between individual packages and between the packages and the substrate.

According to an exemplary embodiment of the present invention, the semiconductor stack package comprises a lower individual package and an upper individual package. Each of the individual packages includes a circuit substrate having a top face and a bottom face; an integrated circuit (IC) chip having an upper surface and a lower surface, the lower surface being attached to the top face of the circuit substrate; a plurality of solder balls formed on the bottom face of the circuit substrate; a heat-conducting layer provided on the bottom face of the circuit substrate; and a heat-mediating layer provided on the upper surface of the IC chip.

The upper individual package is stacked on the lower individual package through the solder balls of the upper individual package. The heat-conducting layer of the upper individual package touches the heat-mediating layer of the lower individual package, thus producing a direct heat-dissipating path.

The semiconductor stack package comprises at least one first individual package and at least one second individual package. The first individual package includes a circuit substrate having a top face and a bottom face, an integrated circuit (IC) chip having an upper surface and a lower surface, the upper surface being attached to the bottom face of the circuit substrate, and a plurality of solder balls formed on the bottom face of the circuit substrate. The second individual package includes a circuit substrate having a top face and a bottom face, an IC chip having an upper surface and a lower surface, the lower surface being attached to the top face of the circuit substrate, and a plurality of solder balls formed on the bottom face of the circuit substrate.

The second individual package is stacked on the first individual package through the solder balls of the second individual package. A heat-dissipating path from the IC chip of the first individual package is made downward toward the circuit substrate, and a heat-dissipating path from the IC chip of the second individual package is made upward.

DETAILED DESCRIPTION OF THE PREFERRED EMBODIMENTS

Figure 1:
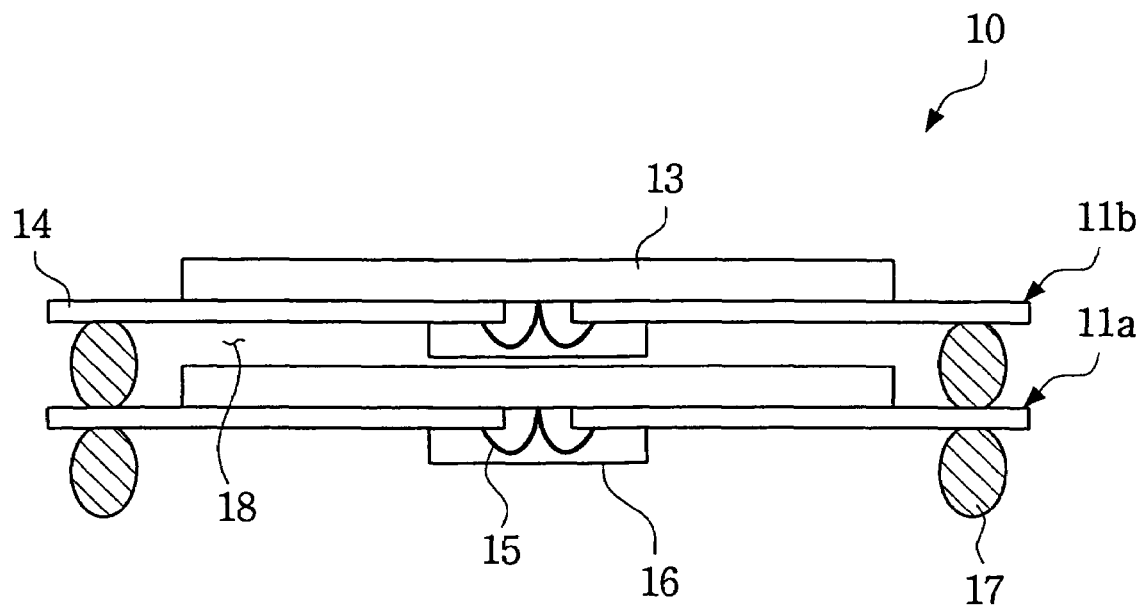
FIG. 1 is a cross-sectional view of a conventional stack package.
Figure 2:
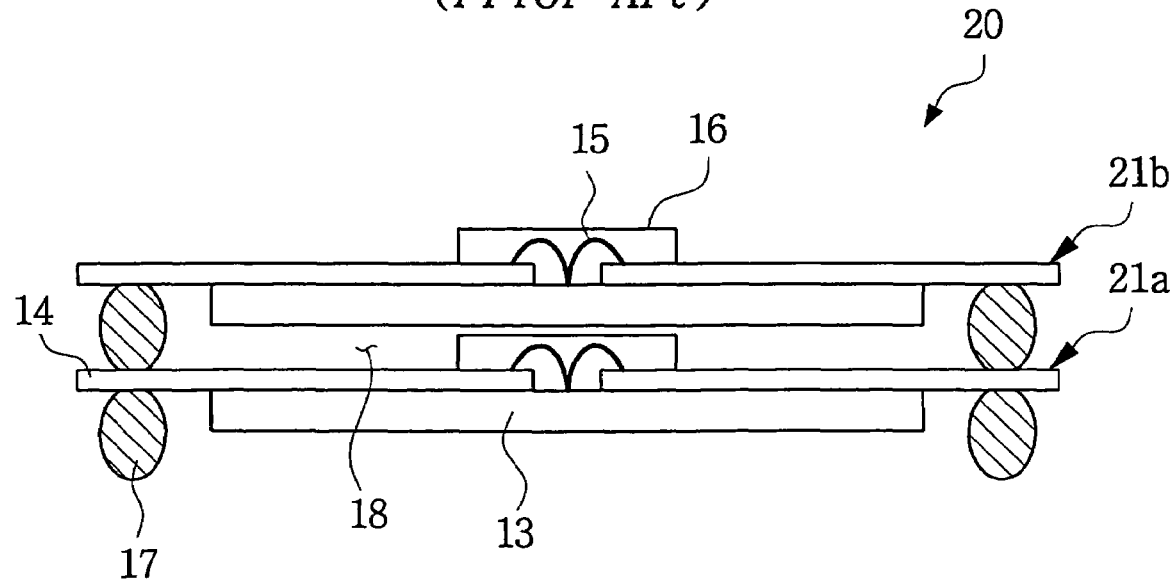
FIG. 2 is a cross-sectional view of another conventional stack package.
Figure 3:
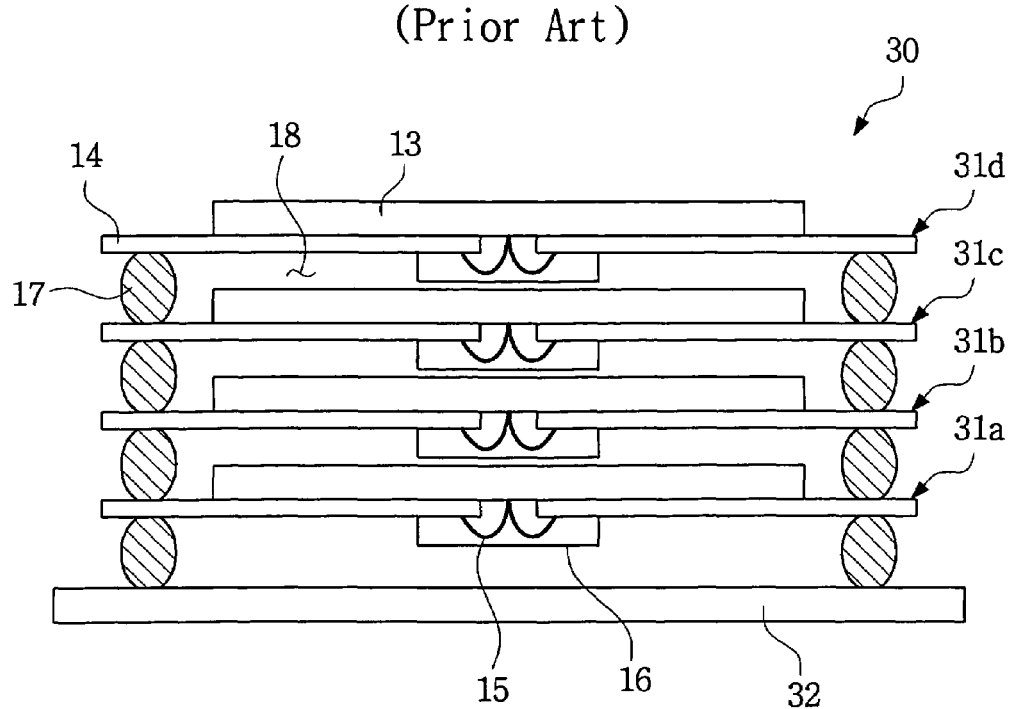
FIG. 3 is a cross-sectional view of still another conventional stack package.
Figure 4:
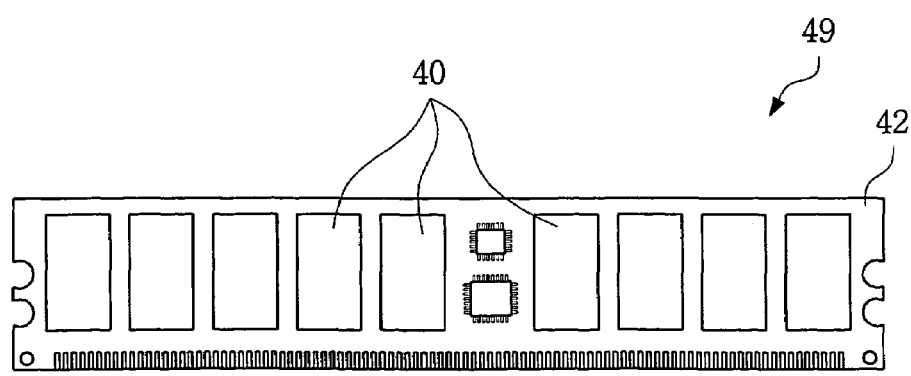
FIG. 4 is a plan view of a conventional memory module.
Figure 5:
FIG. 5 is a temperature distribution diagram of a simulation of heat dissipation in a conventional stack package.

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

In the description, well-known structures and processes have not been described or illustrated in detail to avoid obscuring the present invention. It will be appreciated that the figures are not drawn to scale. Rather, for simplicity and clarity of illustration, the dimensions of some of the elements are exaggerated relative to other elements. Like reference numerals and characters are used for like and corresponding parts of the various drawings.

First Exemplary Embodiment

Figure 6:
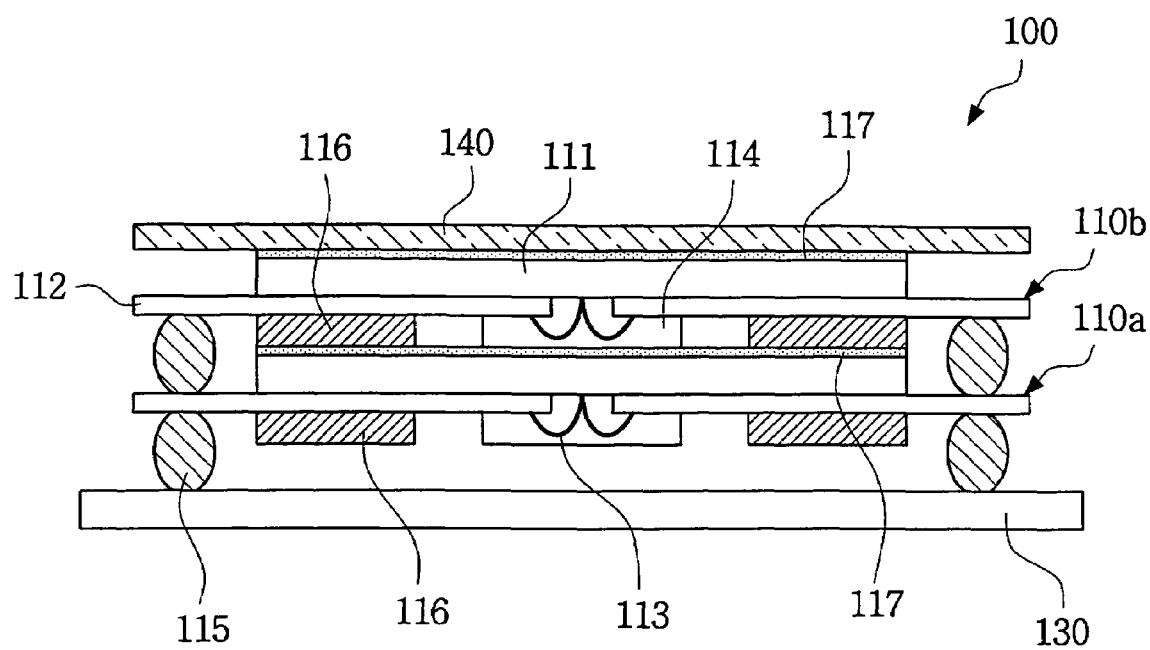
FIG. 6 is a cross-sectional view of a stack package in accordance with a first exemplary embodiment of the present invention.
Figure 7A:
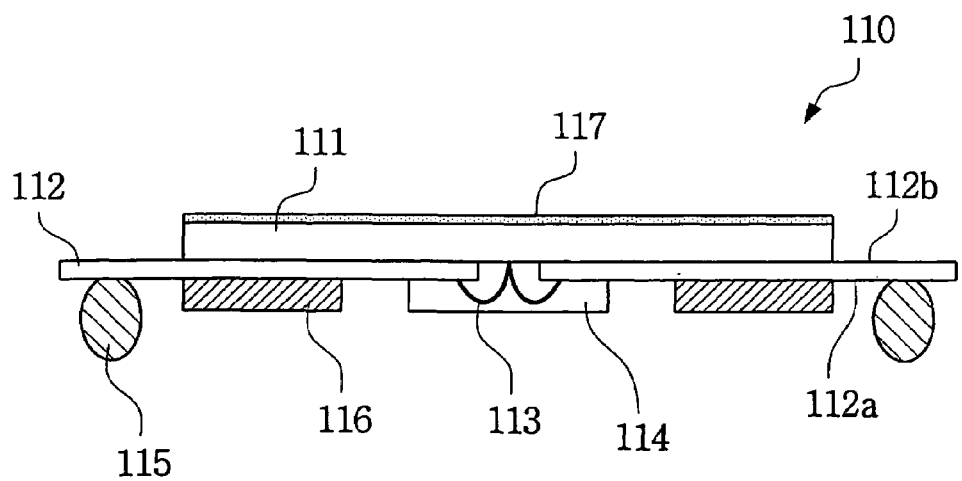
FIG. 7A is a cross-sectional view of an individual package used in the stack package shown in FIG. 6.
Figure 7B:
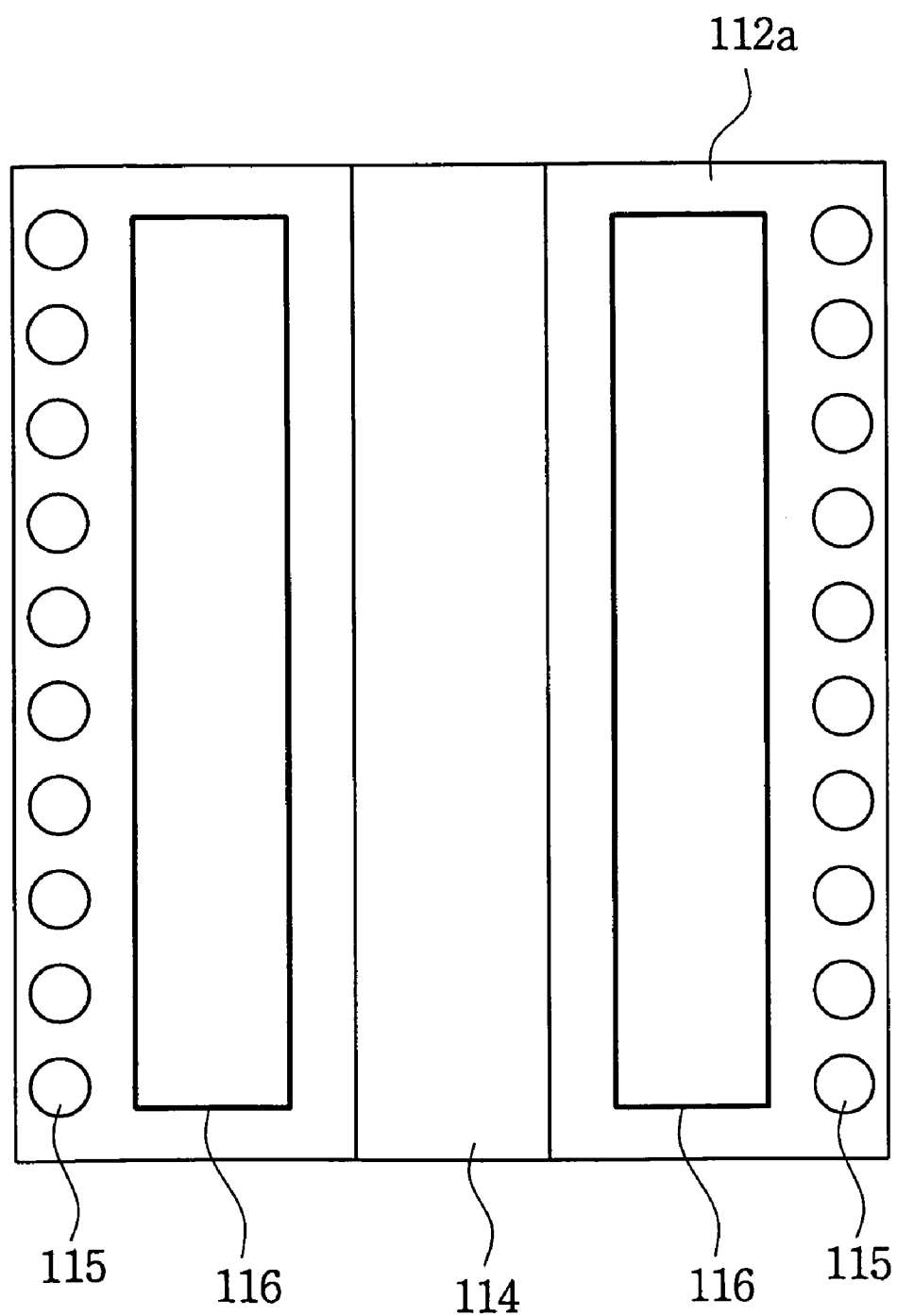
FIG. 7B is a plan view showing a bottom configuration of the individual package shown in FIG. 7A.
Figure 7C:
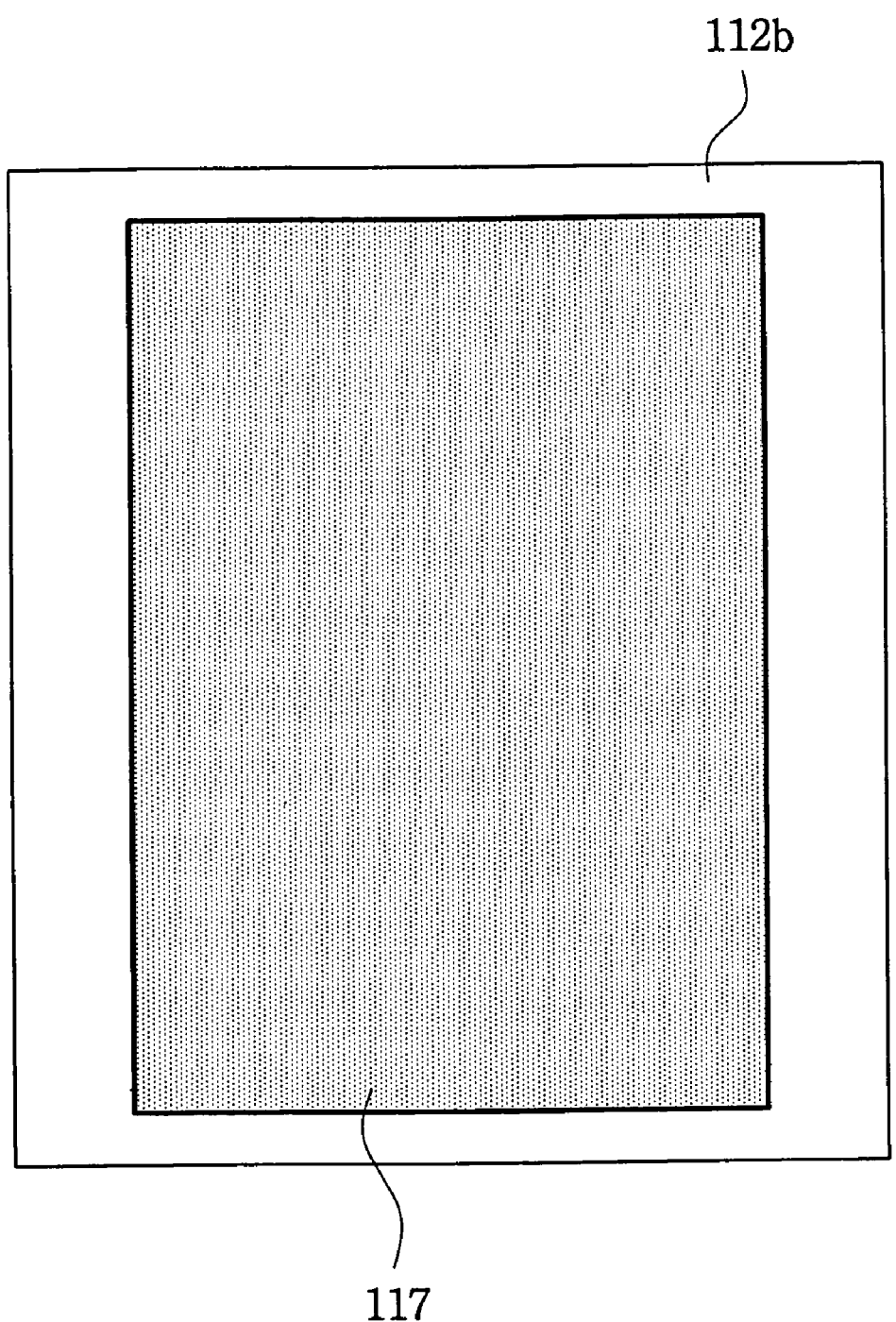
FIG. 7C is a plan view showing a top configuration of the individual package shown in FIG. 7A.

A cross-section of a stack package in accordance with a first exemplary embodiment of the present invention is shown in FIG. 6. The stack package 100, shown in FIG. 6, has a two-layered structure in which two individual packages 110a and 110b are arranged in layers. A lower individual package 110a has the same configuration as an upper individual package 110b. A cross-section of each individual package is shown in FIG. 7A. Furthermore, FIGS. 7B and 7C show, in plan views, bottom and top configurations of the individual package shown in FIG. 7A.

Referring to FIGS. 6, 7A, 7B and 7C, each individual package 110 includes an integrated circuit (IC) chip 111 that is attached to a circuit substrate 112. The circuit substrate 112 has a top face 112b to which the IC chip 111 is attached, and a bottom face 112a opposite the top face 112b. The circuit substrate 112 also has a central opening that extends lengthwise. The IC chip 111 has chip pads (not shown) that are formed on an active surface, i.e., a bottom surface in the drawings, of the IC chip 111. The active surface of the IC chip 111 is attached to the top face 112b of the circuit substrate 112 so that the chip pads are exposed through the opening of the circuit substrate 112.

The IC chip 111 is electrically coupled to the circuit substrate 112 via metal wires 113. That is, each metal wire 113 connects the chip pad of the IC chip 111 and a circuit pattern (not shown) on the bottom face 112a of the circuit substrate 112, passing through the opening of the circuit substrate 112. Further, the metal wires 113 are protected from external environments by an encapsulant 114. The encapsulant 114 is provided in the opening and neighboring parts on the bottom face 112a of the circuit substrate 112 so as to cover the metal wires 113. In addition, solder balls 115 are formed in rows at peripheral parts on the bottom face 112a of the circuit substrate 112. The circuit patterns, connected to the metal wires 113, are extended to the solder balls 113 and provide electrical paths.

The upper individual package 110b is stacked on the lower individual package 110a through the solder balls 115. That is, the solder balls 115 on the bottom face 112a of the circuit substrate 112 of the upper individual package 110b are joined to the top face 112b of the circuit substrate 112 of the lower individual package 110a, and thereby mechanically and electrically connecting both individual packages 110a and 110b. To receive the solder balls 115, ball lands (not shown) are formed on the top face 112b of the circuit substrate 112 of the lower package 110a. The ball lands are electrically coupled to the circuit patterns of the circuit substrate 112.

Further, the solder balls 115 of the lower individual package 110a are mechanically joined and electrically coupled to a module board 130. That is, the stack package 100 is mounted on the module board 130 through the solder balls 115 of the lower individual package 110a.

In particular, each individual package 110 has a heat-conducting layer 116 on the bottom face 112a of the circuit substrate 112, and a heat-mediating layer 117 on a back surface, i.e., a top surface in the drawings, of the IC chip 111.

The heat-conducting layer 116 is attached to a part between the encapsulant 114 and the solder ball 115 on the bottom face 112a of the circuit substrate 112. The heat-conducting layer 116 is made of a flat, thin, rigid plate having excellent heat conductivity, such as copper, aluminum, stainless steel, and a great variety of alloys. The heat-mediating layer 117 is attached to the almost entire back surface of the IC chip 111. The heat-mediating layer 117 is made of a flexible tape or liquid material having excellent heat conductivity and electrical insulation. An adhesive tape that is used for chip supports in a wafer sawing process may be used. A liquid material may contain fillers to enhance heat conductivity.

When the upper individual package 110b is stacked on the lower individual package 110a to form the stack package 100, the heat-conducting layer 116 of the upper package 110b touches the heat-mediating layer 117 of the lower package 110a. Thus, the layer of trapped air found in conventional stack packages is eliminated and a direct heat-dissipating path is produced through both the heat-conducting layer 116 and the heat-mediating layer 117. Therefore, heat dissipation of the stack package 100 is improved.

Additionally, the stack package 100 may further include a heat sink 140 that is attached to the top of the stack package, namely, to the heat-mediating layer 117 of the upper individual package 110b. The heat dissipation of the stack package 100 can be further improved because the heat sink 140 is surrounded by air.

Second Exemplary Embodiment

Figure 8:
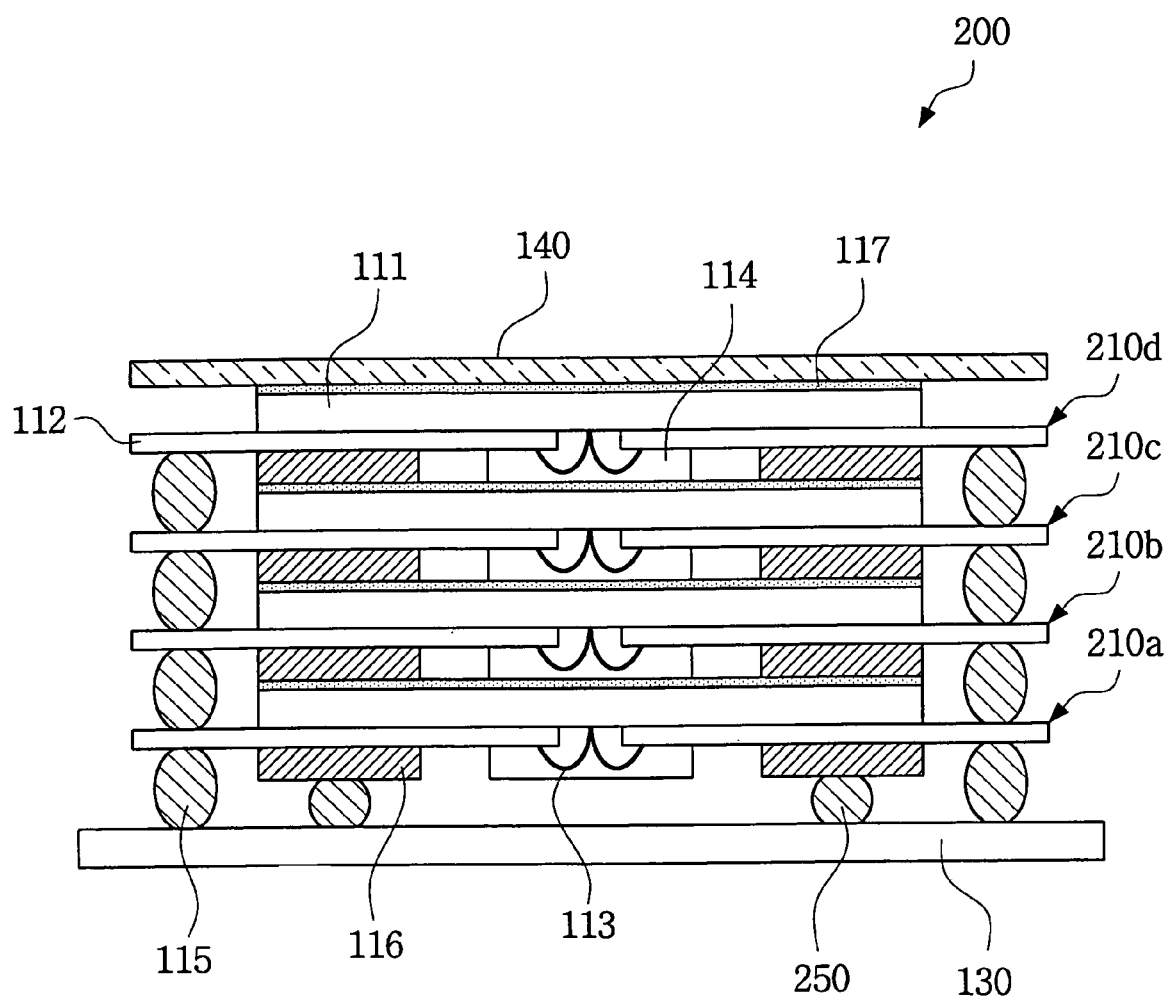
FIG. 8 is a cross-sectional view of a stack package in accordance with a second exemplary embodiment of the present invention.

A cross-section of a stack package in accordance with a second exemplary embodiment of the present invention is shown in FIG. 8. The stack package 200, shown in FIG. 8, has a four-layered structure in which four individual packages 210a, 210b, 210c and 210d are arranged in layers. Each individual package 210a, 210b, 210c and 210d has the same configuration as described in the foregoing embodiment.

Figure 9:
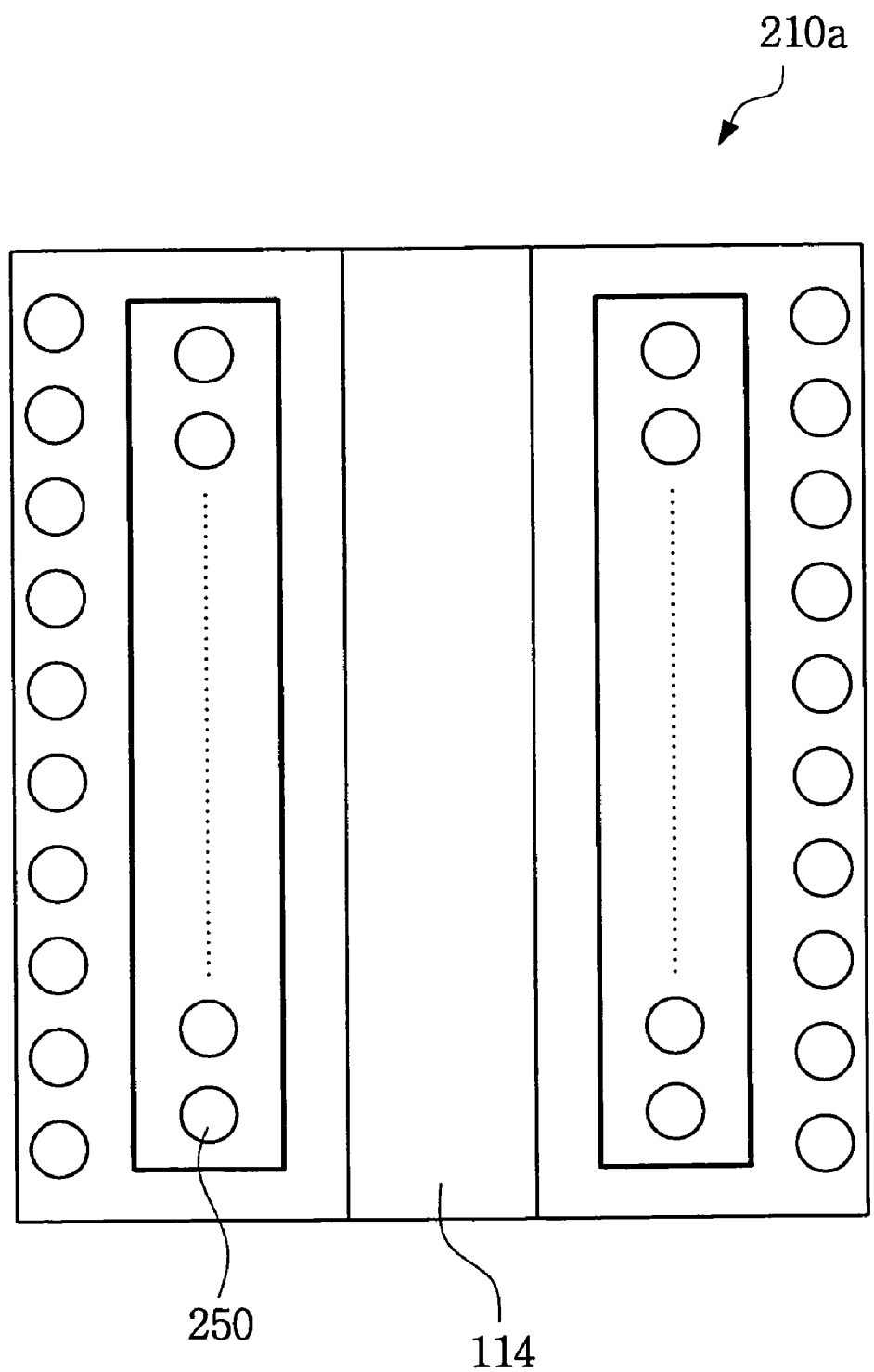
FIG. 9 is a plan view showing a bottom configuration of a lowermost individual package used in the stack package shown in FIG. 8.

The stack package 200 particularly includes a plurality of dummy balls 250 that are provided between the lowermost individual package 210a and the module board 130. FIG. 9 shows, in a plan view, a bottom configuration of the lowermost individual package 210a.

Referring to FIGS. 8 and 9, the dummy balls 250 are formed in rows at the heat-conducting layer 116 on the bottom face of the circuit substrate 112, creating additional heat-dissipating paths from the lowermost individual package 210a to the module board 130. Thus, the heat dissipation of the stack package 200 can be further improved because of the dummy balls 250. Further, the dummy balls 250 are used as ground paths. Thus the electrical property of the stack package 200 can also be improved. In addition, the dummy balls 250 serve to enhance the joint reliability of the solder balls 115 and thus, the mounting reliability of the stack package 200 can be improved. Such desirable dummy balls 250 may be added to the two-layered stack package of the first embodiment.

Third Exemplary Embodiment

Figure 10:
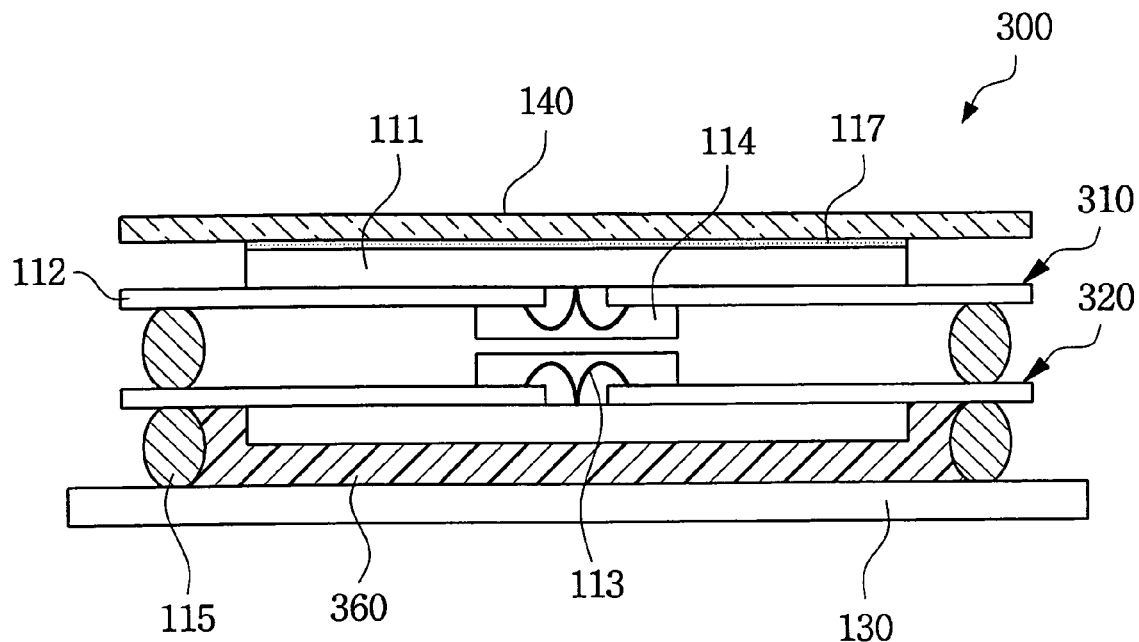
FIG. 10 is a cross-sectional view of a stack package in accordance with a third exemplary embodiment of the present invention.

A cross-section of a stack package in accordance with a third exemplary embodiment of the present invention is shown in FIG. 10. The stack package 300, shown in FIG. 10, has a two-layered structure in which two individual packages 310 and 320 are arranged in layers. Unlike the foregoing embodiments, the upper and lower individual packages 310 and 320 are slightly different from each other in configuration.

Referring to FIG. 10, the upper individual package 310 has a configuration that the active surface of the IC chip 111 is attached to the top face of the circuit substrate 112, whereas the lower individual package 320 has an opposite configuration with the active surface of the IC chip 111 attached to the bottom face of the circuit substrate 112. All the solder balls 115 of both individual packages 310 and 320 are still provided on the bottom face of the respective circuit substrates 112.

Particularly, each of the IC chips 111 faces the outside of the stack package 300. This configuration may be further advantageous to heat dissipation because heat generated from the IC chips 111 can be easily dispersed. That is, since the IC chip 111 of the upper individual package 310 faces outward, a heat-dissipating path from the IC chip 111 exists outward, i.e., directly toward the air. Further, since the IC chip 111 of the lower individual package 320 faces inward, a heat-dissipating path from the IC chip 111 exists inward, i.e., directly toward the module board 130. Therefore, an air gap between both individual packages 310 and 320 does not adversely affect the heat dissipation of the stack package 300.

The stack package 300 of this embodiment particularly includes an underfill layer 360 that fills the entire space between the lower individual package 320 and the module board 130. The underfill layer 360 may be formed of resinous material with heat-conducting and stress-buffering properties, so that the underfill layer 360 can improve the heat dissipation and the mounting reliability of the stack package 300. The underfill layer 360 may be applied to the stack packages of the earlier embodiments.

The stack package 300 of this embodiment may further have the above-discussed heat sink 140 attached to the upper individual package 310, and the heat-mediating layer 117 interposed between the upper package 310 and the heat sink 140.

The symmetric configuration of the upper and lower individual packages 310 and 320 may be effective in preventing well-known package warpage problems.

Fourth Exemplary Embodiment

Figure 11:
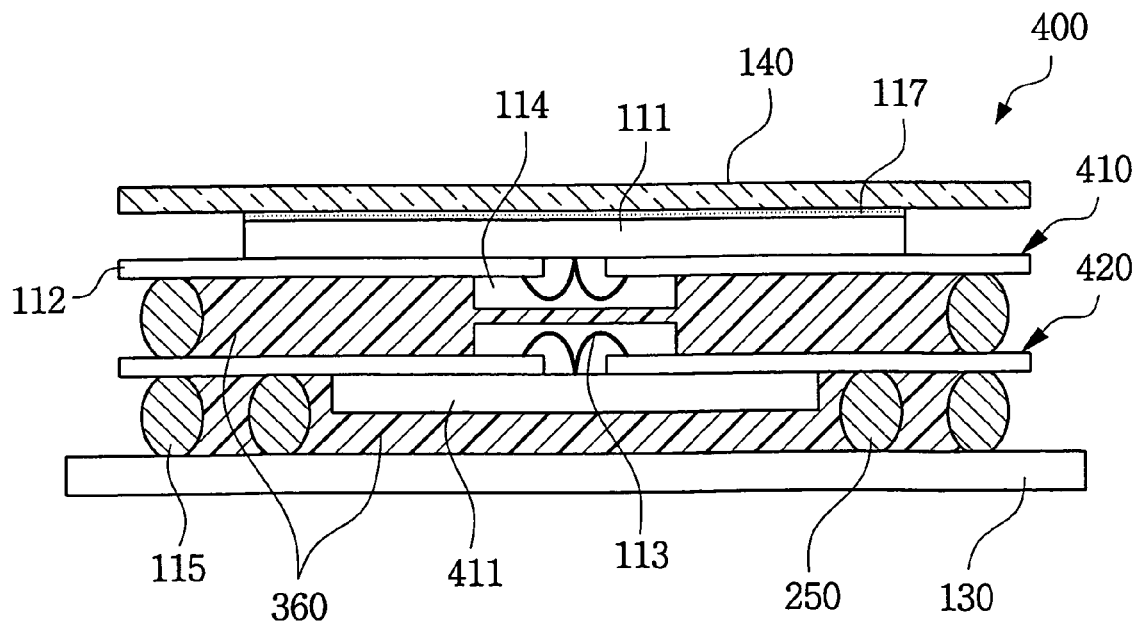
FIG. 11 is a cross-sectional view of a stack package in accordance with a fourth exemplary embodiment of the present invention.

A cross-section of a stack package in accordance with a fourth exemplary embodiment of the present invention is shown in FIG. 11. The stack package 400, shown in FIG. 11, has a two-layered structure and a symmetric configuration similar with the foregoing third embodiment. However, in the stack package 400 of this embodiment, a lower individual package 420 has a relatively smaller IC chip 411 in comparison with the IC chip 111 of an upper individual package 410. That is, the stack package 400 of this embodiment is an example of using different sizes and different kinds of IC chips 111 and 411.

If the IC chip of the lower individual package faces inward toward the module board 130 as discussed above in the third embodiment, it may be difficult to provide the dummy balls between the lower individual package and the module board. However, if the IC chip 411 of the lower individual package 420 is smaller, it becomes possible to provide the dummy balls 250 around the IC chip 411 as illustrated.

Optionally, the underfill layer 360, as discussed above in the previous third embodiment, may fill a space between the upper and lower individual packages 410 and 420 as well as a space between the lower individual package 420 and the module board 130.

Fifth Exemplary Embodiment

Figure 12:
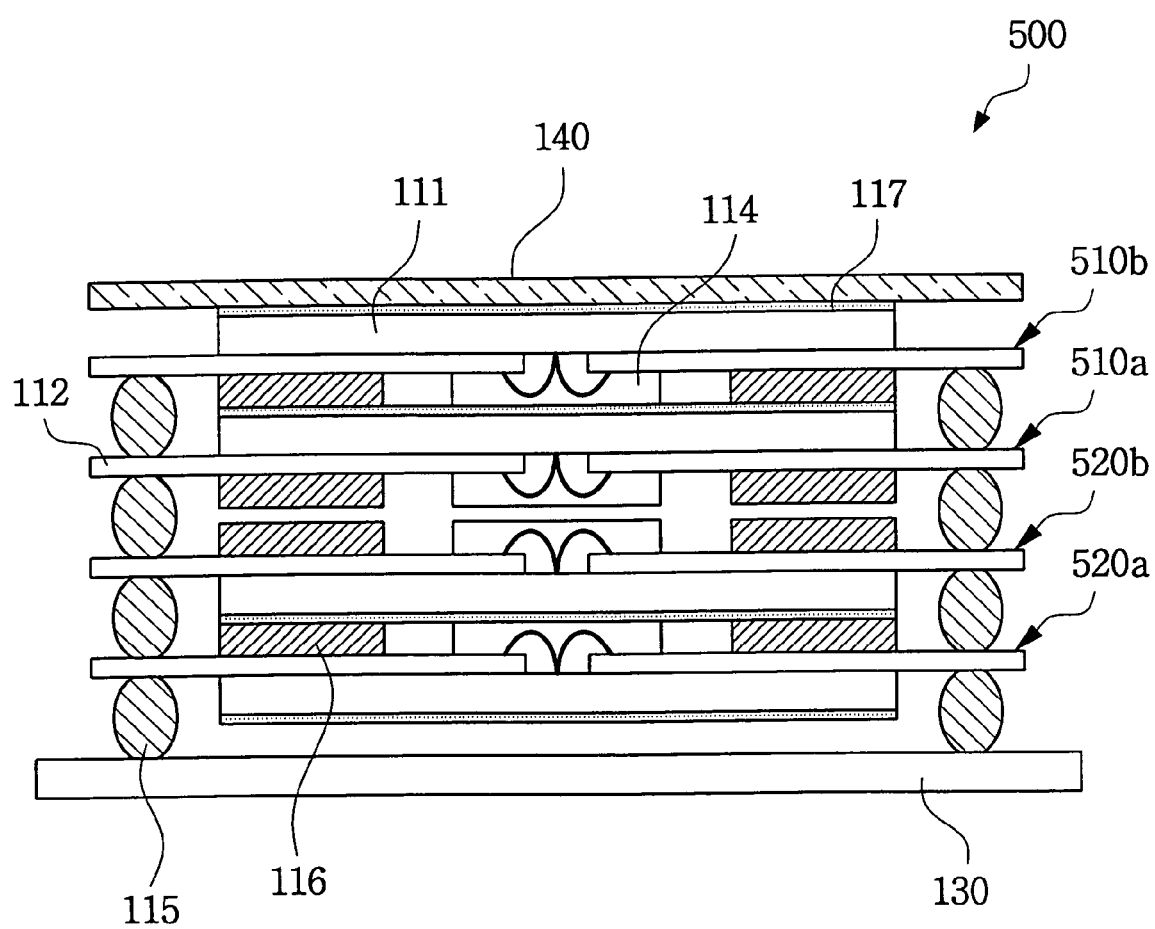
FIG. 12 is a cross-sectional view of a stack package in accordance with a fifth exemplary embodiment of the present invention.

A cross-section of a stack package in accordance with a fifth exemplary embodiment of the present invention is shown in FIG. 12. The stack package 500, shown in FIG. 12, has a four-layered structure similar with the foregoing second embodiment. Furthermore, upper individual packages 510*a* and 510*b* and lower individual packages 520*a* and 520*b* form a symmetric configuration.

A configuration between the upper individual packages 510*a* and 510*b* is substantially the same. Similarly, a configuration between the lower individual packages 520*a* and 520*b* is substantially the same. Thus, unfavorable air gaps may exist between the upper individual packages 510*a* and 510*b* and/or between the lower individual packages 520*a* and 520*b*. Therefore, the stack package 500 of this embodiment has the heat-conducting layers 116 and the heat-mediating layers 117 as discussed above in the earlier first embodiment.

Sixth Exemplary Embodiment

The aforementioned stack packages of several types may be used for a memory module. A cross-section of a memory module in accordance with a sixth exemplary embodiment of the present invention is shown in FIG. 13.

Figure 13:
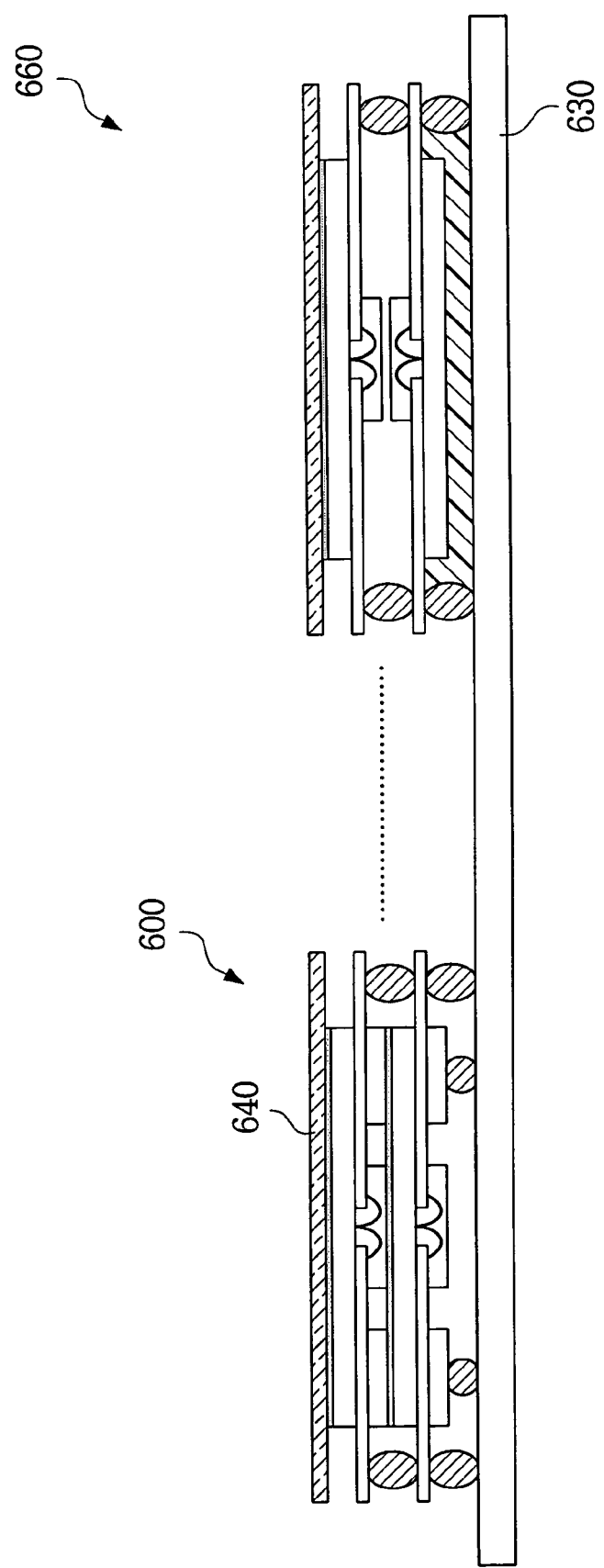
FIG. 13 is a cross-sectional view of a memory module in accordance with a sixth exemplary embodiment of the present invention.

Referring to FIG. 13, the memory module 660 includes a plurality of stack packages 600 that are mounted in a row on a first surface of a module board 630. Each of the stack packages 600 used for the memory module 660 is one of the stack packages having a two-layered structure as discussed above in the first, third, and fourth embodiments.

The stack packages 600 may have respective heat sinks 640, which not only promote the effective heat dissipation toward the air, but also prevent the IC chips from external physical attack or shock.

Seventh Exemplary Embodiment

The memory module may use the four-layered stack packages and may receive the stack packages on both surfaces of the module board. A cross-section of a memory module in accordance with a seventh exemplary embodiment of the present invention is shown in FIG. 14.

Figure 14:
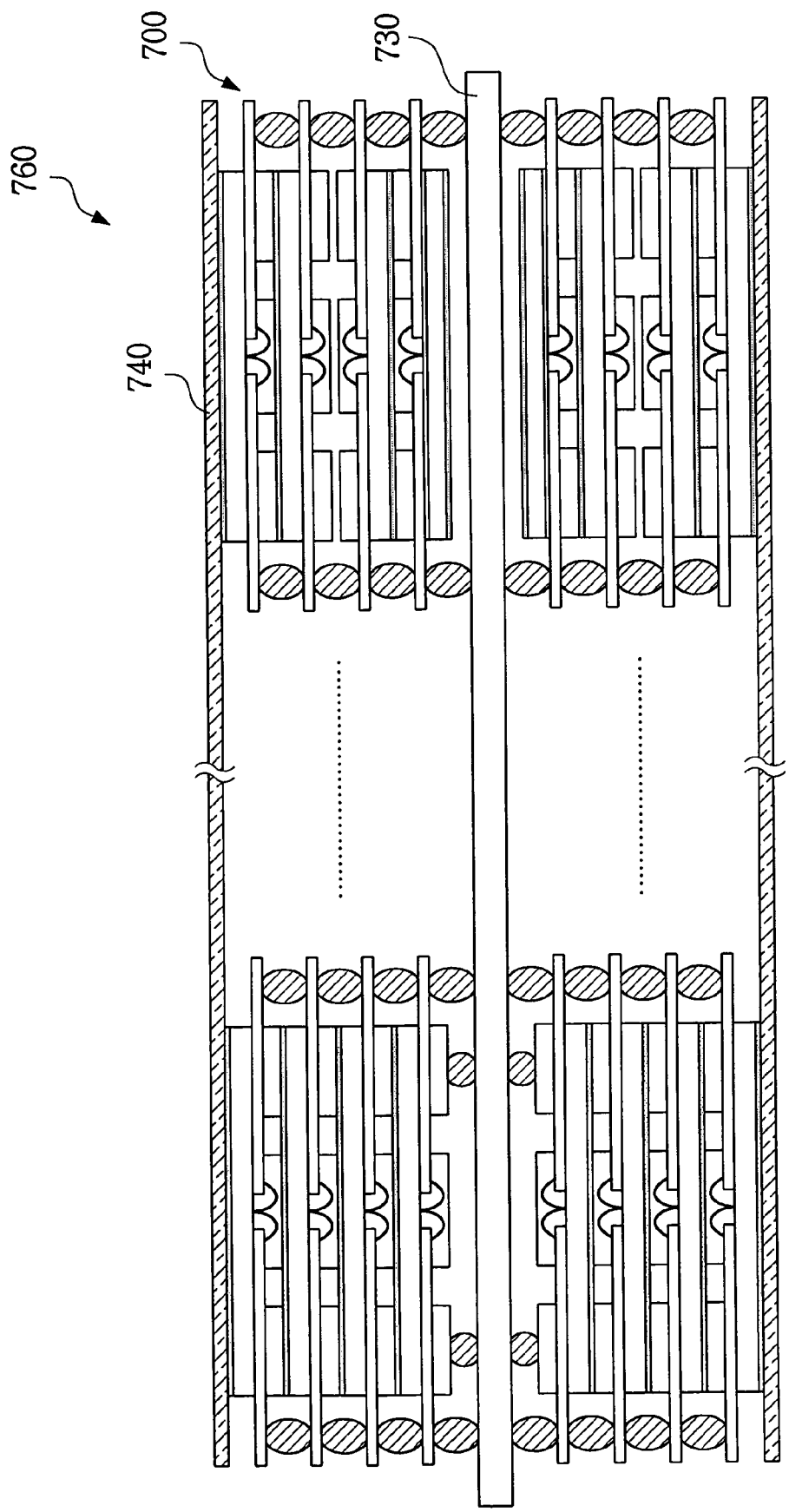
FIG. 14 is a cross-sectional view of a memory module in accordance with a seventh exemplary embodiment of the present invention.

Referring to FIG. 14, the memory module 760 includes a plurality of stack packages 700 that are mounted in a row on first and second surfaces of a module board 730. Each of the stack packages 700 is one of the stack packages having a four-layered structure as discussed above in the second and fifth embodiments.

The memory module 760 of this embodiment has two heat sinks 740, each of which covers and is attached to all the stack packages 700 arranged on one surface of the module board 730.

While this invention has been particularly shown and described with reference to several exemplary embodiments thereof, it will be understood by those skilled in the art that various changes in form and details may be made therein without departing from the spirit and scope of the invention as defined by the appended claims.

What is claimed is:

1. A semiconductor stack package comprising:
    at least one first package including a circuit substrate having a top face, a bottom face, and a central opening, an integrated circuit (IC) chip having an upper surface and a lower surface, the upper surface being attached to the bottom face of the circuit substrate, a plurality of solder balls formed on the bottom face of the circuit substrate, and an encapsulant formed on the upper face of the circuit substrate in the central opening;
    wherein the first package includes a lower individual package and an upper individual package, each individual package including a circuit substrate having a top face and a bottom face, an integrated circuit (IC) chip having an upper surface and a lower surface, the upper surface being attached to the bottom face of the circuit substrate, and a plurality of solder balls formed on the bottom face of the circuit substrate,
    wherein each individual package has a heat-conducting layer on the top face of the circuit substrate and a heat-mediating layer on the lower surface of the IC chip,
    wherein the upper individual package is stacked on the lower individual package by connecting the solder balls of the upper individual package to the top face of the circuit substrate of the lower individual package, and
    wherein the heat-mediating layer of the upper individual package touches the heat-conducting layer of the lower individual package, thus producing a direct heat-dissipating path; and
    at least one second package including a circuit substrate having a top face, a bottom face, and a central opening, an IC chip having an upper surface and a lower surface, the lower surface being attached to the top face of the circuit substrate, a plurality of solder balls formed on the bottom face of the circuit substrate, and an encapsulant formed on the bottom face of the circuit substrate in the central opening,
    wherein the second package is stacked on the first package by connecting the solder balls of the second package to the top face of the circuit substrate of the first package creating a heat-dissipating path from the IC chip of the first package in a direction away from the second package, and a heat-dissipating path from the IC chip of the second package in a direction away from the first package.

2. The semiconductor stack package of claim 1, wherein the heat-conducting layer is a highly heat conductive flat, thin, rigid plate.

3. The semiconductor stack package of claim 1, wherein the heat-mediating layer is an electrically insulative and highly heat conductive flexible tape or liquid material.

4. The semiconductor stack package of claim 1, further comprising:
    a heat sink attached to the upper surface of the IC chip of the second package.

5. The semiconductor stack package of claim 1, further comprising:
    a module board to which the solder balls of the first package mechanically and electrically connect.

6. The semiconductor stack package of claim 5, further comprising:
    a plurality of dummy balls formed between the circuit substrate of the first package and the module board.

7. The semiconductor stack package of claim 5, further comprising:
    an underfill layer filling a space between the first package and the module board.

8. The semiconductor stack package of claim 1, further comprising:
    an underfill layer filling a space between the first package and the second package.

9. A semiconductor stack package comprising:
    at least one first package including a circuit substrate having a top face, a bottom face, and a central opening, an integrated circuit (IC) chip having an upper surface and a lower surface, the upper surface being attached to the bottom face of the circuit substrate, a plurality of solder balls formed on the bottom face of the circuit substrate, and an encapsulant formed on the upper face of the circuit substrate in the central opening; and at least one second package including a circuit substrate having a top face, a bottom face, and a central opening, an IC chip having an upper surface and a lower surface, the lower surface being attached to the top face of the circuit substrate, a plurality of solder balls formed on the bottom face of the circuit substrate, and an encapsulant formed on the bottom face of the circuit substrate in the central opening, wherein the second package is stacked on the first package by connecting the solder balls of the second package to the top face of the circuit substrate of the first package creating a heat-dissipating oath from the IC chip of the first package in a direction away from the second package, and a heat-dissipating path from the IC chip of the second package in a direction away from the first package, wherein the second package includes a lower individual package and an upper individual package, each individual package including a circuit substrate having a top face and a bottom face, an integrated circuit (IC) chip having an upper surface and a lower surface, the lower surface being attached to the top face of the circuit substrate, and a plurality of solder balls formed on the bottom face of the circuit substrate, wherein each individual package has a heat-conducting layer on the bottom face of the circuit substrate and a heat-mediating layer on the top surface of the IC chip, wherein the upper individual package is stacked on the lower individual package by connecting the solder balls of the upper individual package to the top face of the circuit substrate of the lower individual package, and wherein the heat-mediating layer of the lower individual package touches the heat-conducting layer of the upper individual package, thus producing a direct heat-dissipating path.

10. The semiconductor stack package of claim 9, wherein the heat-conducting layer is a highly heat conductive flat, thin, rigid plate.

11. The semiconductor stack package of claim 9, wherein the heat-mediating layer is an electrically insulative and highly heat conductive flexible tape or liquid material.

12. A semiconductor stack package comprising:
at least one first package including:
  a circuit substrate having a top face, a bottom face, and a central opening;
  an integrated circuit (IC) chip, the IC chip comprising:
    an upper surface; and
    a lower surface, the lower surface being attached to the top face of the circuit substrate;
  a heat-mediating layer on the top surface of the IC chip;
  a plurality of wires electrically connecting the IC chip to the circuit substrate;
  an encapsulant formed on the bottom face of the circuit substrate and covering the central opening around the wires;
  a plurality of solder balls formed on the bottom face of the circuit substrate; and
  a heat-conducting layer on the bottom face of the circuit substrate between the encapsulant and the solder balls,
wherein the first package includes a lower individual package and an upper individual package, each individual package including:
  a circuit substrate having a top surface and a bottom surface;
  an integrated circuit (IC) chip having an upper surface and a lower surface, the lower surface being attached to the top surface of the circuit substrate; and
  a plurality of solder balls formed on the bottom surface of the circuit substrate,
wherein each individual package has a heat-conducting layer on the bottom face of the circuit substrate and a heat-mediating layer on the upper surface of the IC chip,
wherein the upper individual package is stacked on the lower individual package by connecting the solder balls of the upper individual package to the top surface of the circuit substrate of the lower individual package, and
wherein the heat-mediating layer of the upper individual package contacts the heat-conducting layer of the lower individual package, thus producing a direct heat-dissipating path; and
at least one second package including
  a circuit substrate having a top face, a bottom face, and a central opening;
  an IC chip comprising:
    an upper surface; and
    a lower surface, the lower surface being attached to the top face of the circuit substrate;
  a plurality of solder balls formed on the bottom face of the circuit substrate; and
  an encapsulant formed on the bottom face of the circuit substrate and covering the central opening,
wherein the second package is stacked on the first package by connecting the solder balls of the second package to the top face of the circuit substrate of the first package creating a heat-dissipating path from the IC chip of the first package in a direction away from the second package, and a heat-dissipating path from the IC chip of the second package in a direction away from the first package.

13. The semiconductor stack package of claim 12, further comprising:
a heat sink attached to the upper surface of the IC chip of the second package.

14. The semiconductor stack package of claim 12, further comprising:
a module board to which the solder balls of the first package mechanically and electrically connect.

15. The semiconductor stack package of claim 12, further comprising:
an underfill layer substantially completely filling a space between the first package and the second package.

16. A semiconductor stack package comprising:
at least one first package including:
  a circuit substrate having a top face, a bottom face, and a central opening;
  an integrated circuit (IC) chip, the IC chip comprising:
    an upper surface; and
    a lower surface, the lower surface being attached to the top face of the circuit substrate;
  a heat-mediating layer on the top surface of the IC chip;
  a plurality of wires electrically connecting the IC chip to the circuit substrate;
  an encapsulant formed on the bottom face of the circuit substrate and covering the central opening around the wires;
  a plurality of solder balls formed on the bottom face of the circuit substrate; and
  a heat-conducting layer on the bottom face of the circuit substrate between the encapsulant and the solder balls; and at least one second package including
- a circuit substrate having a top face, a bottom face, and a central opening;
- an IC chip comprising:
  - an upper surface; and
  - a lower surface, the lower surface being attached to the top face of the circuit substrate;
- a plurality of solder balls formed on the bottom face of the circuit substrate; and
- an encapsulant formed on the bottom face of the circuit substrate and covering the central opening, wherein the second package is stacked on the first package by connecting the solder balls of the second package to the top face of the circuit substrate of the first package creating a heat-dissipating path from the IC chip of the first package in a direction away from the second package, and a heat-dissipating path from the IC chip of the second package in a direction away from the first package, wherein the second package includes a lower individual package and an upper individual package, each individual package including a circuit substrate having a top surface and a bottom surface, an integrated circuit (IC) chip having an upper surface and a lower surface, the lower surface being attached to the top surface of the circuit substrate, and a plurality of solder balls formed on the bottom surface of the circuit substrate, wherein each individual package has a heat-conducting layer on the bottom surface of the circuit substrate and a heat-mediating layer on the upper surface of the IC chip, wherein the upper individual package is stacked on the lower individual package by connecting the solder balls of the upper individual package to the top surface of the circuit substrate of the lower individual package, and wherein the heat-mediating layer of the lower individual package contacts the heat-conducting layer of the upper individual package, thus producing a direct heat-dissipating path.

* * * * *

UNITED STATES PATENT AND TRADEMARK OFFICE
CERTIFICATE OF CORRECTION

PATENT NO.        : 7,473,993 B2                                    Page 1 of 1
APPLICATION NO.   : 11/057007
DATED             : January 6, 2009
INVENTOR(S)       : Joong-Hyun Baek et al.

It is certified that error appears in the above-identified patent and that said Letters Patent is hereby corrected as shown below:

Column 9, line 12, the word "oath" should read -- path --.

Signed and Sealed this

Twelfth Day of May, 2009

JOHN DOLL
*Acting Director of the United States Patent and Trademark Office*